United States Patent [19]

Nakamura

[11] Patent Number: 4,525,790
[45] Date of Patent: Jun. 25, 1985

[54] METHOD FOR OSCILLATING ULTRASONIC WAVES AND A MICROCOMPUTER'S BUILT-IN ULTRASONIC WAVE OSCILLATOR CIRCUITRY

[75] Inventor: Masahiro Nakamura, Tokyo, Japan

[73] Assignee: Ohtake Works Company, Ltd., Tokyo, Japan

[21] Appl. No.: 412,274

[22] Filed: Aug. 27, 1982

[30] Foreign Application Priority Data

Aug. 28, 1981 [JP] Japan .............................. 56-134248

[51] Int. Cl.³ .............................................. G06F 15/20
[52] U.S. Cl. .................................. 364/484; 364/508; 73/602
[58] Field of Search ..................... 364/484, 508, 475; 73/602, 642

[56] References Cited

U.S. PATENT DOCUMENTS

| 4,134,302 | 1/1979 | Matay .............................. 73/642 X |
| 4,271,705 | 6/1981 | Crostack .............................. 73/602 |
| 4,310,891 | 1/1982 | Kabushiki .......................... 364/484 |
| 4,312,044 | 1/1982 | Baba ................................. 364/484 X |
| 4,365,301 | 12/1982 | Arnold et al. ................. 364/560 X |
| 4,409,659 | 10/1983 | Devine ............................ 364/508 X |

Primary Examiner—Edward J. Wise
Attorney, Agent, or Firm—Patrick H. Hume

[57] ABSTRACT

A method for oscillating ultrasonic waves and a microcomputer's built-in ultrasonic wave oscillator circuitry being capable of tracking and regulating ultrasonic wave vibrations automatically to be oscillated stably at a resonant frequency of a vibrator. An amplified excitation signal, having a necessary oscillating frequency regulated and amplified in accordance with an input adjusting voltage value signal, is output from an operating unit section. A high-frequency wave current value signal, flowing through a vibrator, after the amplified excitation signal is introduced, is issued from a vibration system to a conversion-transmission section. The adjusting voltage value signal and the high-frequency wave current value signal are converted and then transmitted to the operating unit section, and a microcomputer, respectively. The microcomputer monitors changes in the resonant frequency of the vibrator by always detecting a peak high-frequency wave current value signal flowing through the vibrator with a calculating process which that consecutively compares the memorized high-frequency wave current value signal with a new high-frequency wave current value signal coming from the conversion-transmission section. The output is the voltage value signal adjusted by tracking the peak high-frequency wave current value signal, from the microcomputer.

6 Claims, 6 Drawing Figures

METHOD FOR OSCILLATING ULTRASONIC WAVES AND A MICROCOMPUTER'S BUILT-IN ULTRASONIC WAVE OSCILLATOR CIRCUITRY

This invention relates to a method for oscillating ultrasonic waves and a microcomputer's built-in ultrasonic wave oscillator circuit with its method, which is capable of following and regulating ultrasonic wave vibrations to be oscillated stably at a resonant frequency of a vibrator, and which is further widely utilized in ultrasonic machining, cleaning, cell breaking, probing, etc.

Basic features of the ultrasonic wave oscillator circuitry are that the load of the oscillator is changed easily and that the oscillator circuitry is used in series for a long time, for example, generally for 10 hours and sometimes for 24 hours. Consequently, heat generation by electric power consumption is excessive and the thermal conditions in a condenser connected to a vibrator and in the core of an associated transformer become a problem.

In ultrasonic machining, welding, etc., conventionally, a vibrator and a metalic horn were combined with and bonded to each other to be utilized for mechanical resonant frequencies in an oscillating system. In this kind of oscillating system, the mechanical resonance becomes sharped, in general, to be effective, and its resonant frequency is changed under conditions of the operation. In such a hunt for, follow, or track, it is necessary to chase an oscillating frequency to which the frequency of ultrasonic waves is tuned to restore the efficiency. Given a case that, when an oscillating device is used as an electric power amplifier, the mechanical vibration of the oscillating system is converted into a proportional voltage value that is fed back to an input of the amplifier for a vibrating feed-back oscillation, it is not so difficult to automate the tuning but there is a problem when the characteristic of a change is from one amplitude to one of mechanical load. When attention is paid to the amplitude characteristic in the vibrating feed-back oscillation system, if the mechanical load is increased and mechanical amplitude is lessened the feed-back voltage, and the input and output voltages of the amplifier, are reduced together to weaken the vibration. This problem is not insurmountable because the saturation point is approached when the amplifier is electrically energized. Therefore, if a limiter is attached to the amplifier, it will have the same mechanical load characteristic as in the case where there is no vibrating feed-back oscillation. However, the construction of the device becomes complex. Further, there are some defects that arise when the bonding force is weakened due to temperature increase during use, that cause the pressure sensor to peel off from the vibrator, due to the strong vibration, also making connections complicated.

Generally, ultrasonic vibrators, in terms of manufacture, vary greatly in quality, for example, in a resonant frequency and a resonant impedance. Tools and horns are not able to have a stable resonant frequency due to errors of measurement in manufacture and abrasion by use. Therefore, the conventional ways and means have disadvantages in interchangebility and maintenance due to need for readjustment.

On the other hand, the automatic tracking circuitry employing a PLL circuit has a defect in that a lock frequency is out of phase with the given frequency when the output is reduced.

If a good quality function is added to the conventional device, it will be complicated and cumbersome. Additionally, if the conventional device employs a plurality of analog circuits, it will be necessary to adjust many points, for instance, off-set of the operation amplifier circuit, scale factor, oscillating frequency of the PLL circuit, phase of the phase circuit, and so forth.

The main object of this invention is to provide a method for oscillating ultrasonic waves and a microcomputer's built-in ultrasonic wave oscillator circuitry in which the regulation quantity inspection and the adjustment quantity calculation operations are effectively accomplished regardless of frequency, by automatically tracking changes of the resonant frequency of the vibrator of the ultrasonic wave oscillator.

Another object of this invention is to provide a method for oscillating ultrasonic waves and a microcomputer's built-in ultrasonic wave oscillator circuitry which works well without interference from extraneous components of higher harmonics and noise.

Another object of this invention is to provide a method for oscillating ultrasonic waves and a microcomputer's built-in ultrasonic wave oscillator circuitry in which the regulation of inspection to detect changes of the resonant frequency of the vibrator of the ultrasonic wave oscillator circuitry is determined by a value of the high frequency current flowing through the vibrator.

Another object of this invention is to provide a method for oscillating ultrasonic waves and a microcomputer's built-in ultrasonic wave oscillator circuitry in which the automatic response to changes of the resonant frequency of the vibrator of the ultrasonic wave oscillator circuitry is regulated by a microcomputer.

Another object of this invention is to provide a method for oscillating ultrasonic waves and a microcomputer's built-in ultrasonic wave oscillator circuitry that is of compact size with its number of elemental parts greatly reduced.

A further object of this invention is to provide a method for oscillating ultrasonic waves and a microcomputer's built-in ultrasonic wave oscillator circuitry in which adjustments for various circuits forming an oscillator circuitry are fewer than heretofor.

A further object of this invention is to provide a method for oscillating ultrasonic waves and a microcomputer's built-in ultrasonic wave oscillator circuitry in which interchangeability between the oscillator circuitry and a vibrator is readily effected.

A still further object of this invention is to provide a method for oscillating ultrasonic waves and a microcomputer's built-in ultrasonic wave oscillator circuitry which includes a digital timer function with a programming operation.

Other objects of this invention will be clear from the following specification, read in conjunction with the accompanying drawings.

First of all, the basic principles of this invention will be stated.

This invention comprises an operating unit section, a vibration system, a conversion-transmission section, and a microcomputer. In the operating unit section, in accordance with an input adjusting voltage value signal, an amplified excitation signal having a necessary oscillating frequency is dispatched to the vibration system. In the vibration system, after the amplified excitation signal is received, a high-frequency wave current value signal flowing through a vibrator is consecutively emitted. In the conversion-transmission section, the adjusting voltage signal is converted and transmitted to the operating unit section, while the high-frequency wave current value signal is also converted and transmitted to a microcomputer. In the microcomputer, the high-frequency wave current value signal, which is received from the conversion-transmission section, and then memorized, is calculated in accordance with the operational order of a prestored program, for always tracking the peak high-frequency wave current value signal to monitor changes of the resonant frequency. The microcomputer output calculates the adjusting voltage value signal that is compared with, and tracks, the peak high-frequency wave current value signal. Every time the microcomputer detects a reduced high-frequency wave current value signal flowing through the vibrator, which is caused from changes of the resonant frequency, the oscillating frequency of the operating unit section is, to a greater or less degree, swept as the result of the peak high-frequency wave current value signal being tracked. The adjusting quantity corresponding to the peak high-frequency wave current value signal is fed back to the operating unit section to keep the peak high-frequency wave current value signal flowing through the vibrator. Thus, the resonant frequency of the vibrator is tracked and maintained automatically.

Figure 1:
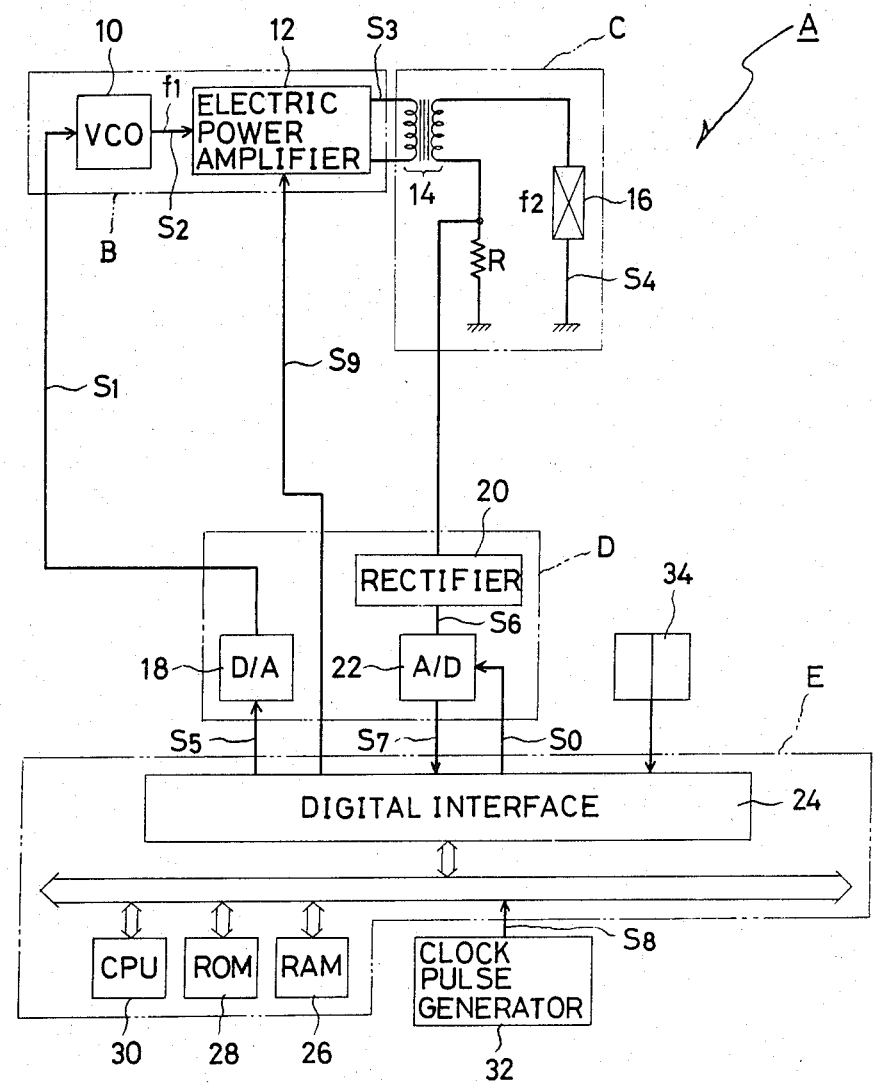
FIG. 1 is a block diagram showing the constitution in accordance with an oscillator of this invention.

Referring to FIG. 1, a representative embodiment of the oscillator circuitry of this invention will be explained.

An ultrasonic wave oscillator circuitry (A) of this invention comprises an operating unit section (B), a vibration system (C), a conversion-transmission section (D) and a microcomputer (E). In the operating unit section (B), an analog adjusting voltage value signal ($S_1$) to be input to a VCO (Voltage Controlled Oscillator) (10) is regulated and converted into an excitation signal ($S_2$) having a necessary oscillating frequency. An electric power amplifier (12) amplifies the excitation signal ($S_2$) and emits an amplified excitation signal ($S_3$). In the vibration system (C), a matching transformer (14) transforms the amplified excitation signal ($S_3$) by which a vibrator (16) is excited, while an analog alternating high-frequency wave current value signal ($S_4$) flowing through the vibrator (16) is output through a resistor (R). In the conversion-transmission section, the analog adjusting value signal ($S_1$) into which an input digital adjusting voltage value signal ($S_5$) is converted by a D/A converter (18) is output to the operating unit section (B). The analog alternating high-frequency wave current value signal ($S_4$) input from the vibration system (C) is rectified by a rectifier (20) into an analog direct high-frequency wave current value signal ($S_6$), which is converted into a digital high-frequency wave current value signal ($S_7$) by an A/D converter (22) upon receiving a work timing command signal ($S_0$). In the microcomputer (E), the digital high-frequency wave current value signal ($S_7$) consecutively input from the conversion-transmission section (D) is memorized through a digital interface (24) in a designated address of a RAM (Random Access Memory) (26). The digital high-frequency wave current value signal ($S_7$) is calculated by a CPU (Central Processing Unit) (30) in accordance with the operational order of the calculation method or the program prestored in a ROM (Read Only Memory). When reduction of the digital high-frequency wave current value signal ($S_7$) due to changes of a resonant frequency ($f_2$) of the vibrator (16) is detected, the digital adjusting voltage value signal ($S_5$) to be output is forced to be swept across higher and lower values. Every time the peak digital high-frequency wave current value signal is detected, the signal ($S_7$) is prestored in the designated address of the RAM (26) so that changes of a resonant frequency ($f_2$) of the vibrator (16) can be constantly monitored, and the digital adjusting voltage value signal ($S_5$), calculated by its changes, is dispatched to the conversion-transmission section (D) through the digital interface (24).

The microcomputer (E) is connected to a clock pulse generator (32) to get a clock pulse signal ($S_8$) and includes a timer function making the work of the oscillator circuitry (A) stop for programming changes. The oscillator circuitry (A) stops when the electric power amplifier (12) of the operating unit section (B) receives an oscillator stop command signal ($S_9$) issued from the CPU (30), which counts up the value set by a digital switch (34) in response to the clock pulse signal ($S_8$).

Figure 4:
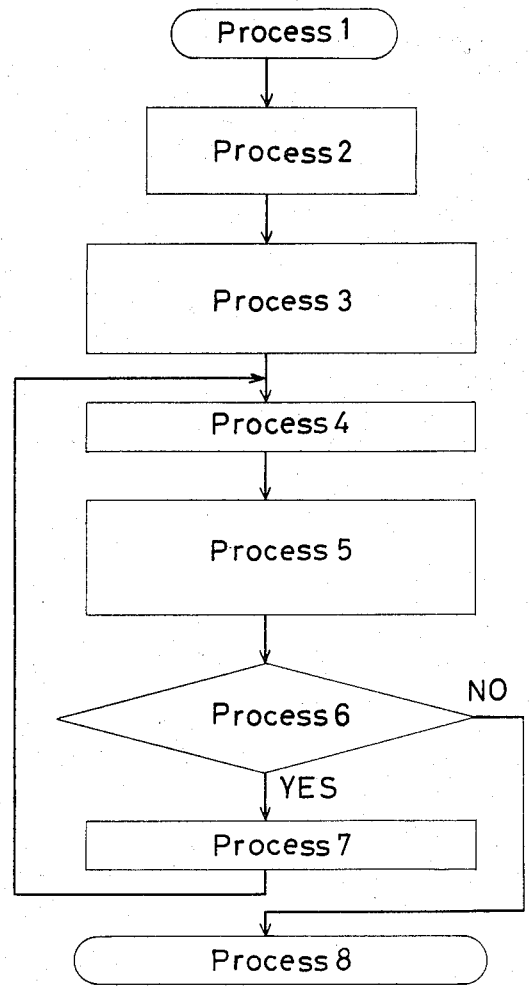
FIG. 4 is a programmatic flowchart for detecting an initial peak digital high-frequency wave current value signal.

The microcomputer (E) has three (3) programs prestored in the ROM (28). As shown in FIG. 4, the No. 1 program for detecting the initial peak current value signal ($S_7$) carries out the following procedures or processes:

Process (1) Start

Process (2) Converting the minimum value of the digital adjusting voltage value signal ($S_5$) into the analog signal ($S_1$). Beginning the scanning from the lowest oscillating frequency ($f_1$).

Process (3) Storing the high-frequency wave current value signal ($S_7$) in the RAM (26-1) after the A/D conversion. The RAM (26-1) means address 1 designated in the RAM (26).

Process (4) Putting-out the analog adjusting voltage value signal ($S_1$) increased by one bit. Increasing the oscillating frequency ($f_1$) of the VCO (10) by the minimum unit of the D/A converter (18).

Process (5) Storing the high-frequency wave current value signal ($S_7$) in the RAM (26-2) after the A/D conversion. The RAM (26-2) means address 2 designated in the RAM (26).

Process (6) Comparing the up-dated value signal ($S_7$) stored in the RAM (26-2) with the value signal ($S_7$) stored in the RAM (26-1) to determine whether the former is equal to or greater than the latter.

Process (7) Exchanging the values stored in RAM (26-1) and (26-2).

Process (8) Terminating the detection for the maximum high-frequency wave current value signal ($S_7$).

The final reading from the RAM (26-1) is the maximum digital high-frequency wave current value signal (S7).

Decreasing the highest scanned oscillating frequency bit by bit is carried out in the same manner as described, above.

Figure 5:
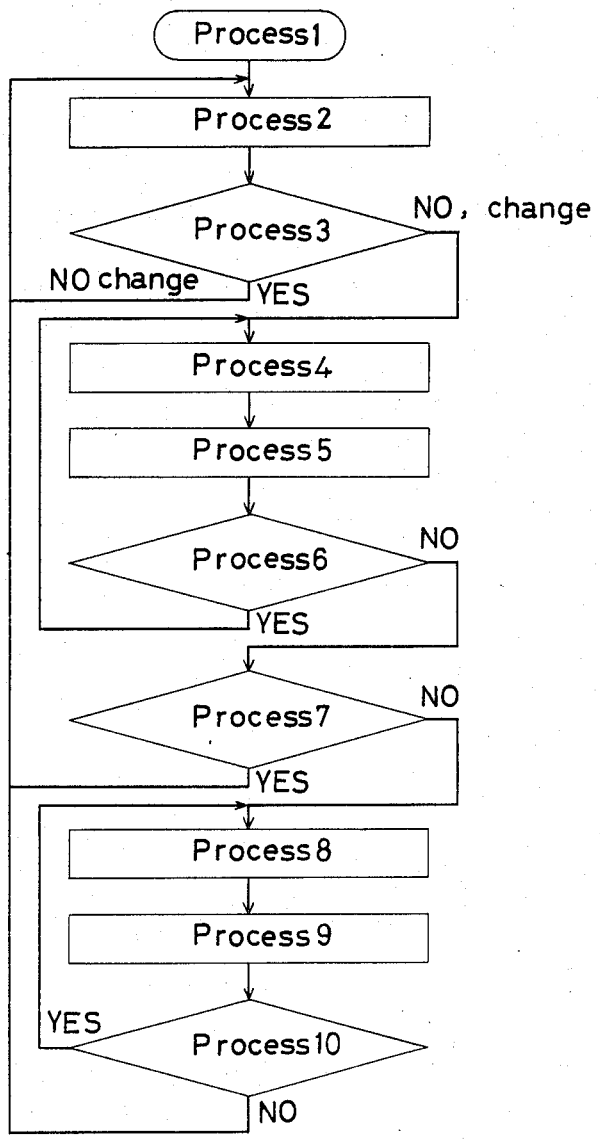
FIG. 5 is a programmatic flowchart for automatically following or tracking a change of an oscillating frequency by detecting a reduction of a peak digital high-frequency wave current value signal.

As shown in FIG. 5, the No. 2 program for automatically tracking changes in the oscillating frequency (f1), by detecting the reduction of the digital high-frequency wave current value signal (S7), is carried out by the following processes:

Process (1) Start

Process (2) Storing the high-frequency wave current value signal (S1) in the RAM (26-1) after the A/D conversion.

Process (3) Comparing the up-dated value signal (S7) stored in the RAM (26-2) with the value signal (S7) stored in the RAM (26-1) to determine whether the former is equal to or greater than the latter. "Change" means detecting the fall of the digital high-frequency wave current value signal (S7).

Process (4) Putting-out the analog adjusting voltage value signal (S1) decreased by one bit; i.e., upon lowering of the oscillating frequency (f1).

Process (5) Comparing the up-dated high-frequency wave current value signal (S7) already stored in the RAM (26-2) after the A/D conversion.

Process (6) Determines whether the up-dated value signal (S7) is greater than the value signal (S7) already stored in the RAM (26-2) or not.

Process (7) Determines whether the up-dated value signal (S7) is equal to that already stored in the RAM (26-2) or not. "No" means the compared value is less than the value signal (S7) already stored in the RAM (26-2).

Process (8) Putting-out the analog adjusting voltage value signal (S1) increased by one bit; i.e., upon the raising of the oscillating frequency (f1).

Process (9) Comparing the up-dated high-frequency wave current value signal (S7) with the value already stored in the RAM (26-2) after the A/D conversion.

Process (10) Determines whether the up-dated value signal (S7) is greater than the value signal (S7) already stored in the RAM (26-2) or not.

This program is able always to control the oscillating frequency (f1) by forming a loop to perform an interruption upon receiving the clock pulse signal (S8), in accordance with Program No. 3, next below.

Figure 6:
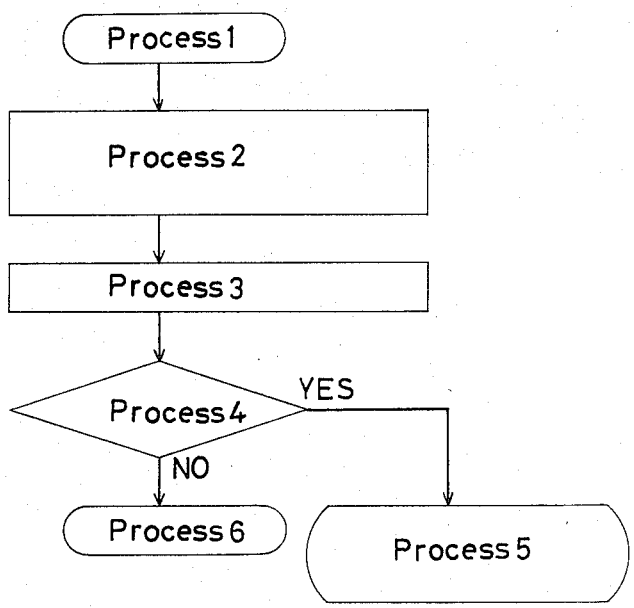
FIG. 6 is a programmatic flowchart for a timer function.

As shown in FIG. 6, the No. 3 program for the timer function (interruption) carries out the following processes:

This program starts at an interval of one clock pulse signal (S8):

Process (1) Interruption

Process (2) Storing the clock pulse signal (S8) in the RAM (26-3) after conversion of the latter, plus one, into binary code. The RAM (26-3) means address 3 designated in the RAM (26).

Process (3) Comparing the resulting value with that of the set value of the digital switch (34).

Process (4) Determining whether the resulting value accords with the set value of the digital switch (34) or not.

Process (5) Stopping the oscillator (A) by means of issuing the oscillator stop command signal (S9) from the CPU (30) to the electric power amplifier (12).

Process (6) Return.

As aforementioned, the processing program for the automatic tracking is able always to detect a drop in the digital peak high-frequency wave current value signal (S7). The processing speed thereof is more than ten times per second where a modern integral calculus type of A/D converter is used.

In case the input voltage range is one or more volts, e.g., between 2 and 3 volts, by using a 12 bits D/A converter (18) with an output range of from 0 to 5 volts, the degree of precision of the VCO (10) per one bit is as follows:

$$1/4096 \times 5 \approx 1.22 \times 10^{-3}$$

Accordingly, the VCO (10) continuously and successively controls the oscillating frequency (f1) thereof, with the precision of one bit of the D/A converter (18), which equals approximately 0.122 of a percentage point. With a ten bits converter (A/D), it is possible to read the digital high-frequency wave current value signal (S7) with the degree of precision of approximately 0.10 of a percentage point.

Figure 2:
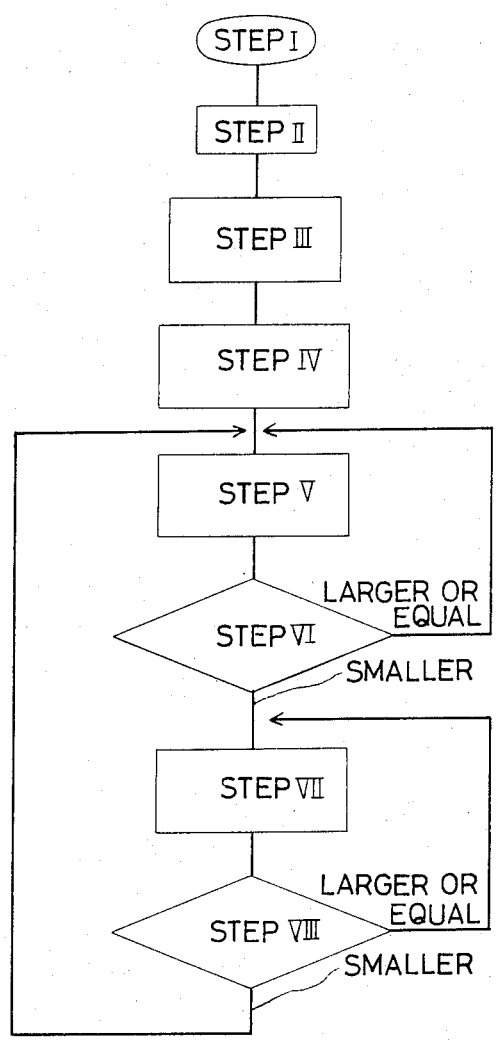
FIG. 2 is a stage block diagram illustrating an operational order in accordance with a method of this invention.
Figure 3:
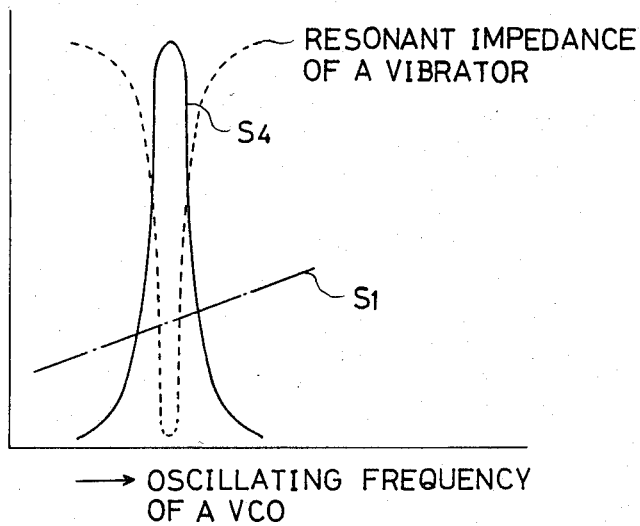
FIG. 3 is a view showing the relationship between a resonant curve and a sweep adjusting voltage value signal according to a method of this invention.

An embodiment of the method of the above in this invention will be explained with reference to FIGS. 1 to 3.

The principle of the method of this invention adopts a phenomenon that the peak high-frequency wave current flows through the vibrator when the vibrator of the ultrasonic wave oscillator circuitry is resonant frequency.

The method of this invention includes steps I to VIII. In step I, a power switch is on for start. In Step II, various settings attached to the microcomputer (E) are adjusted for input, output and mode values, etc. In Step III, in accordance with Program No. 1, the process operation of the CPU (30), the digital adjusting voltage signal (S5) from the microcomputer (E), is transmitted to the D/A converter (18) of the conversion-transmission section (D), where it is converted into the analog adjusting voltage value signal (S1) to be transmitted to the VCO (10) of the operating unit section (B). At the VCO (10) the excitation signal (S2), having a necessary oscillating frequency as an operating quantity, is oscillated and successively amplified by the electric power amplifier (12) for producing the amplified excitation signal (S3). The amplified excitation signal (S3) is transformed by the matching transformer (14) of the vibration system (C) and then transmitted to the vibrator (16). The vibrator (16) is oscillated at around a resonant frequency (f2). In Step IV, in accordance with Program No. 1, the analog alternating high-frequency wave current value signal (S4) flowing through the vibrator (16) is rectified by the rectifier (20) of the conversion-transmission section (D) into the analog direct high-frequency wave current value signal (S6), which is further converted into the digital high-frequency wave current value signal (S7) by the A/D converter (22) at the time when the A/D converter (22) receives the work timing command signal (S0) issued by the command operation of the CPU (30). The digital high-frequency wave current value signal (S7), through the digital interface (24), is consecutively transmitted from the conversion-transmission section (D), to the designated address of the RAM (26), in that order. In Step V, in accordance with the No. 1 Program with the digital adjusting voltage value signal (S5) being changed gradually by the operation of the CPU (30), the amplified excitation signal (S3), having a raised oscillating frequency (f1), is fed from the operating unit section (B) to the vibration system (C). Then, the analog alternating high-frequency wave current value signal ($S_4$) flowing through the vibrator (16) is converted in the conversion-transmission section (D) into the digital high-frequency wave current value signal ($S_7$), which is transmitted to the designated address of the RAM (26) of the microcomputer (E) in that order. In Step VIII, in accordance with Program No. 2, the up-dated digital high-frequency wave current value signal ($S_7$) having been just input to the RAM (26), is compared with the peak digital high-frequency wave current value signal ($S_7$) that was already stored as the result of Step V, in accordance with the calculating method memorized in the ROM (28) by the tracking process of the CPU (30). If the up-dated signal ($S_7$) is equal to or greater than the stored value, the up-dated signal ($S_7$) is returned to Step V and assigned to the designated address of the RAM (26). If the up-dated signal ($S_7$) is lower, it is transmitted to the next Step VII. In the Step VII, in accordance with the No. 2 program, when the amplified excitation signal ($S_3$) having a reduced oscillating frequency ($f_1$) due to a change of the digital adjusting voltage value signal ($S_5$) is transmitted from the operating unit section (B) to the vibration system (C) by the process operation of the CPU (30), the analog alternating high-frequency wave value signal ($S_4$) flowing through the vibrator (16) is converted by the conversion-transmission section (D) into the digital high-frequency wave current value signal ($S_7$), which signal ($S_7$) is input to the designated address of the RAM (26) of the microcomputer (E). In Step VIII, in accordance with the No. 2 program, the up-dated digital current value signal ($S_7$), having been just input to the RAM (26), is compared with the peak digital high-frequency wave current value signal ($S_7$), already stored by the procedure of the Step VII, in accordance with the calculating method memorized in the ROM (28) by the process operation of the CPU (30). If the up-dated signal ($S_7$) is equal to or greater than the stored value, the up-dated signal ($S_7$) is returned to Step VII and fed to the designated address of the RAM (26). If the up-dated signal ($S_7$) is lower, it is returned to Step V, and stored there. The comparative calculating process by the CPU (30) of the microcomputer (E) in accordance with the prestored successive program order (the No. 2 program) is always able to monitor and detect value changes of the peak high-frequency wave current, and, simultaneously, the digital adjusting voltage value signal ($S_5$), corresponding to any such change as calculated by the CPU (30), which new value is consecutively input to the operating unit section (B) through the conversion-transmission section (D). Accordingly, changes of the resonant frequency of the vibrator (16) in the vibration system (C) are automatically tracked and evaluated.

Generally speaking, there seems to be a tendency for the peak value of the high-frequency wave current to be reduced with the elapse of time, due to a change of the resonant frequency, caused from the heat-expansion of the conventional tool and the horn attached to the ultrasonic wave vibrator (16); also, by changes of the resonant frequency ($f_2$), caused from load on the tip of the tool or the horn, and other changes of the oscillating frequency ($f_1$) caused from the thermal drift of the VCO (10) and the power source voltage. Therefore, this invention is constituted to always keep the peak value of the high-frequency wave current by changing the pre-digital adjusting voltage value signal ($S_5$) as soon as the reduction of the peak value is detected. In other words, the above oscillator and the above method of this invention are able to catch changes of the resonant frequency ($f_2$) of the vibrator and track them automatically, and, in addition, to work effectively without interference from higher harmonics and noise components, because there is no dependence on frequency, per se from A/D conversion, through the microcomputer (E), to D/A conversion.

The present invention, further, has a prominent effect, what is called "time function", wherein the electric power amplifier (12) of the operating unit section (B) is interrupted on receiving an oscillator stop command signal ($S_9$), issued in response to a clock pulse signal ($S_8$), that is generated by the clock pulse generator (32) at every interval of time when operating in accordance with the No. 3 program. The CPU (30) of the microcomputer (E), counts each clock pulse signal ($S_9$) and compares it with the reference value signal of the digital switch (34) to determine if both said value signals are coincident with each other.

What is claimed is:

1. A method for oscillating ultrasonic waves comprising, storing an initial peak high-frequency wave current value signal gained by inspecting an oscillating frequency of an oscillator, storing an up-dated peak high-frequency wave current value signal by comparing said up-dated signal with said initial signal previously stored, and repeating the comparison every time an up-dated high-frequency wave current value signal, flowing through a vibrator of said oscillator, is detected as being of lower value, due to changes in the resonant frequency being inspected, and automatically tracking the resonant frequency of said vibrator to renew said up-dated peak high-frequency wave current value signal flowing through said vibrator.

2. The method defined in claim 1, wherein storing said initial peak high-frequency wave current value signal, and storing said up-dated peak value signal, are controlled by a microcomputer that programs such processes.

3. A microcomputer's built-in ultrasonic wave oscillator circuitry comprising, an operating unit section whose output is an amplified excitation signal having a necessary oscillating frequency regulated and amplified in accordance with an input adjusting voltage value signal, a vibration system consecutively emitting a high-frequency wave current value signal flowing through a vibrator after receiving said amplified excitation signal, a conversion-transmission section converting and transmitting said adjusting voltage value signal, and said high-frequency wave current value signal, respectively, to said operating unit section, and a microcomputer, said microcomputer monitoring changes of a resonant frequency of said vibrator by always detecting a peak high-frequency wave current value signal flowing through said vibrator with a consecutively comparative calculating process for said high-frequency wave current value signal to be memorized and recalled from said conversion-transmission section, in accordance with an operational order of a prestored program, and further calculating and releasing said adjusting voltage value signal, following said peak high-frequency wave current value signal.

4. An oscillator circuitry, as defined in claim 3, wherein said microcomputer includes a timer function to stop the oscillator by transmitting an oscillator stop command signal to a working section when a value set by a digital switch attached to said microcomputer is coincident with a clock pulse signal, which latter signal is issued from a clock pulse generator connected to said microcomputer, and counted by said microcomputer.

5. An oscillator circuitry, as defined in claim 3, wherein said conversion-transmission section comprises a D/A converter converting a digital adjusting voltage value signal input from said microcomputer into an analog adjusting voltage value signal, a rectifier rectifying an analog alternating high-frequency wave current value signal input from said vibration system into an analog direct high-frequency wave current value signal, and an A/D converter converting said analog direct high-frequency wave current value signal into a digital high-frequency wave current value signal.

6. An oscillator circuitry, as defined in claim 3, wherein said operating unit section comprises a voltage controlled oscillator (VCO) emitting an excitation signal, the oscillating frequency of which is regulated by an analog adjusting voltage value signal input from said conversion-transmission section, and an electric power amplifier amplifying said excitation signal.

* * * * *